United States Patent
Xie et al.

(10) Patent No.: US 11,869,893 B2
(45) Date of Patent: Jan. 9, 2024

(54) STACKED FIELD EFFECT TRANSISTOR WITH WRAP-AROUND CONTACTS

(71) Applicant: International Business Machines Corporation, Armonk, NY (US)

(72) Inventors: Ruilong Xie, Niskayuna, NY (US); Chun-Chen Yeh, Danbury, CT (US); Alexander Reznicek, Troy, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 17/511,647

(22) Filed: Oct. 27, 2021

(65) Prior Publication Data

US 2022/0052047 A1 Feb. 17, 2022

Related U.S. Application Data

(62) Division of application No. 16/801,904, filed on Feb. 26, 2020, now Pat. No. 11,201,153.

(51) Int. Cl.
*H01L 29/786* (2006.01)
*H01L 27/092* (2006.01)
(Continued)

(52) U.S. Cl.
CPC .... *H01L 27/0924* (2013.01); *H01L 21/02532* (2013.01); *H01L 21/31116* (2013.01);
(Continued)

(58) Field of Classification Search
None
See application file for complete search history.

(56) References Cited

U.S. PATENT DOCUMENTS 7,054,136 B2 5/2006 Ritter et al.
8,115,093 B2 2/2012 Gui et al.
(Continued)

FOREIGN PATENT DOCUMENTS

KR 20010062598 A 7/2001
WO 2011084450 A1 7/2011

OTHER PUBLICATIONS

Ryckaert J. et al., "The Complementary FET (CFET) for CMOS scaling beyond N3," 2018 Symposium on VLSI Technology Digest of Technical Papers: 978-1-5386-4218-4/18/$31.00 © 2018 IEEE; 2 pages.

(Continued)

*Primary Examiner* — Joseph C. Nicely
*Assistant Examiner* — Lamont B Koo
(74) *Attorney, Agent, or Firm* — Cantor Colburn LLP; Kimberly Zillig

(57) ABSTRACT

Embodiments of the present invention are directed to a method for forming a complementary field effect transistor (CFET) structure having a wrap-around contact. In a non-limiting embodiment of the invention, a complementary nanosheet stack is formed over a substrate. The complementary nanosheet stack includes a first nanosheet and a second nanosheet separated by a dielectric spacer. A first sacrificial layer is formed over a source or drain (S/D) region of the first nanosheet and a second sacrificial layer is formed over a S/D region of the second nanosheet. A conductive gate is formed over channel regions of the first nanosheet and the second nanosheet. After the conductive gate is formed, the first sacrificial layer is replaced with a first wrap-around contact and the second sacrificial layer is replaced with a second wrap-around contact.

8 Claims, 11 Drawing Sheets

(51) Int. Cl.
  *H01L 29/08* (2006.01)
  *H01L 29/10* (2006.01)
  *H01L 21/8238* (2006.01)
  *H01L 29/417* (2006.01)
  *H01L 29/66* (2006.01)
  *H01L 21/762* (2006.01)
  *H01L 21/02* (2006.01)
  *H01L 21/311* (2006.01)
  *H01L 29/165* (2006.01)
  *H01L 29/06* (2006.01)

(52) U.S. Cl.
  CPC ............... *H01L 21/76224* (2013.01); *H01L 21/823807* (2013.01); *H01L 21/823814* (2013.01); *H01L 21/823828* (2013.01); *H01L 21/823878* (2013.01); *H01L 29/0673* (2013.01); *H01L 29/0847* (2013.01); *H01L 29/1037* (2013.01); *H01L 29/165* (2013.01); *H01L 29/41758* (2013.01); *H01L 29/6653* (2013.01); *H01L 29/6656* (2013.01); *H01L 29/66545* (2013.01)

(56) References Cited

U.S. PATENT DOCUMENTS

| | | |
|---|---|---|
| 9,773,913 B1 | 9/2017 | Balakrishnan et al. |
| 9,847,390 B1 | 12/2017 | Xie et al. |
| 10,074,727 B2 | 9/2018 | Adusumilli et al. |
| 10,084,094 B1 | 9/2018 | Cheng et al. |
| 10,192,819 B1 | 1/2019 | Chanemougame et al. |
| 10,192,867 B1 | 1/2019 | Frougier et al. |
| 10,236,218 B1 | 3/2019 | Xie et al. |
| 2018/0374958 A1 | 12/2018 | Guillorn et al. |
| 2020/0105751 A1 | 4/2020 | Dewey et al. |

OTHER PUBLICATIONS

Loubet et al., "Stacked Nanosheet Gate-All-Around Transistor to Enable Scaling Beyond FinFET," 2017 Symposium on VLSI Technology Digest of Technical Papers: T230 978-4-86348-605-8 © 2017 JSAP; 2 pages.

List of IBM Patents or Patent Applications Treated as Related; Date Filed: Oct. 27, 2021, 2 pages.

STACKED FIELD EFFECT TRANSISTOR WITH WRAP-AROUND CONTACTS

BACKGROUND

The present invention generally relates to fabrication methods and resulting structures for semiconductor devices, and more specifically, to an improved process and resulting structures for a vertically stacked field effect transistor (SFET) structure having a wrap-around contact.

Known metal oxide semiconductor field effect transistor (MOSFET) fabrication techniques include process flows for constructing planar field effect transistors (FETs). A planar FET includes a substrate (also referred to as a silicon slab); a gate formed over the substrate; source and drain regions formed on opposite ends of the gate; and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, nanosheet FETs include a non-planar architecture that provides increased device density and some increased performance over lateral devices. In non-planar nanosheet FETs, in contrast to conventional planar FETs, the gate stack wraps around the full perimeter of each nanosheet, enabling fuller depletion in the channel region, and reducing short-channel effects due to steeper subthreshold swing (SS) and smaller drain induced barrier lowering (DIBL).

SUMMARY

Embodiments of the invention are directed to a method for forming an SFET structure having a wrap-around contact. A non-limiting example of the method includes forming a complementary nanosheet stack over a substrate. The complementary nanosheet stack includes a first nanosheet and a second nanosheet separated by a dielectric spacer. A first sacrificial layer is formed over a source or drain (S/D) region of the first nanosheet and a second sacrificial layer is formed over a S/D region of the second nanosheet. A conductive gate is formed over channel regions of the first nanosheet and the second nanosheet. After the conductive gate is formed, the first sacrificial layer is replaced with a first wrap-around contact and the second sacrificial layer is replaced with a second wrap-around contact.

Embodiments of the invention are directed to a method for forming an SFET structure having a wrap-around contact. A non-limiting example of the method includes forming a p-type nanosheet stack over a substrate. The p-type nanosheet stack includes a first nanosheet and a second nanosheet. An n-type nanosheet stack is formed over the p-type nanosheet stack. The n-type nanosheet stack includes a third nanosheet and a fourth nanosheet. A first sacrificial layer is formed over a first S/D region of the p-type nanosheet stack and an isolation dielectric is formed on the first sacrificial layer. A second sacrificial layer is formed over a second S/D region of the n-type nanosheet stack and on the isolation dielectric. The first sacrificial layer is replaced with a first wrap-around contact and the second sacrificial layer is replaced with a second wrap-around contact.

Embodiments of the invention are directed to a semiconductor structure. A non-limiting example of the semiconductor device includes a nanosheet stack over a substrate. In some embodiments of the invention, the nanosheet stack is a complementary nanosheet stack. The nanosheet stack includes a top portion and a bottom portion separated by a dielectric spacer. The structure further includes a first S/D region on a sidewall of a nanosheet in the bottom portion of the nanosheet stack and a second S/D region on a sidewall of a nanosheet in the top portion of the nanosheet stack. A first wrap-around contact is formed over the first S/D region and a second wrap-around contact is formed over the second S/D region.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
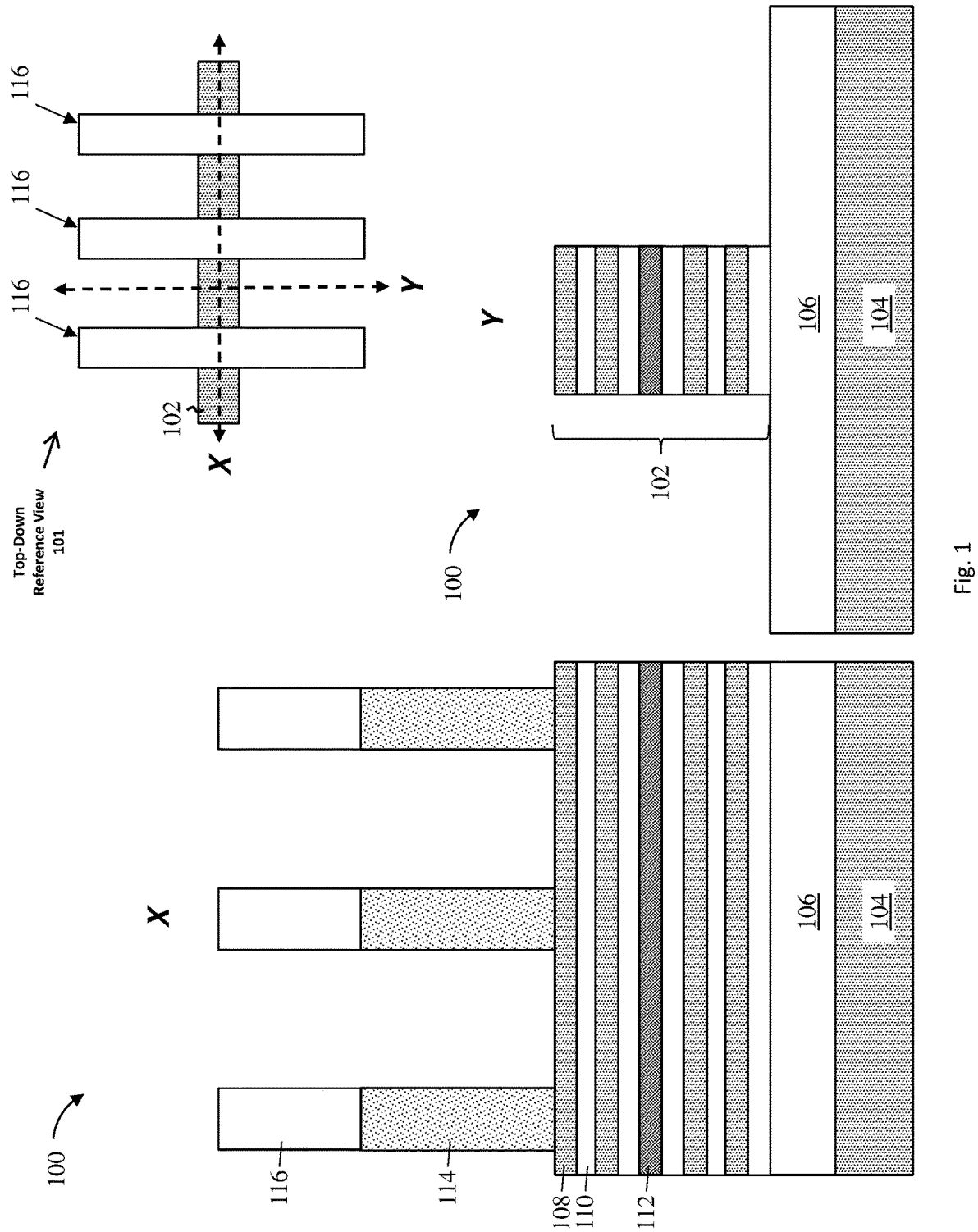
FIG. 1 depicts a top-down reference view, along with cross-sectional views of a semiconductor structure along the lines X and Y of the reference view after a processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, stacked field effect transistors (SFETs) are next generation device structures that offer scaling gains over previous nanosheet and vertical fin type transistor architectures (NS FETs and VFETs, respectively). The SFET represents a further development of the stacked gate all around (GAA) nanowire form of transistor, but one in which two GAA transistors are vertically stacked above the other type so that two transistors share the same device footprint. In this manner, two transistors only require the space of a single transistor.

For example, one nanosheet transistor can stack over another nanosheet transistor, such that device density is doubled. SFETs can allow any combinations of transistors, such as NFET over NFET, PFET over PFET, NFET over PFET, and PFET over NFET. In the cases of NFET over PFET or PFET over NFET, the devices are complementary to each other. An SFET having stacked complementary device types is referred to herein as a stacked complementary field effect transistor (CFET). CFETs are able to efficiently support CMOS logic circuitry due to their inherent reduction in device footprint.

There are limitations, however, in known SFET fabrication techniques. In particular, the SFET source/drain (S/D) is very difficult to form, as compared, for example, to a conventional NS FET. This is partially a result of the epitaxy process used to form the source/drain regions in the SFET structure. In that process, the epitaxies are formed in an almost superposition configuration—where both of the S/D regions occupy the same position when viewed top-down.

Turning now to an overview of aspects of the present invention, one or more embodiments of the invention address the above-described shortcomings of known SFET architectures and fabrication techniques by providing a new SFET semiconductor structure and a method of fabricating the same that uses a replacement wrap-around contact fabrication scheme. In accordance with embodiments of the invention, the novel replacement wrap-round contact fabrication technique does not rely on laterally extending the S/D regions or forming a buried contact early in the fabrication process.

While the following description is based on an SFET having complementary transistors (NFET over PFET or PFET over NFET) for ease of discussion, it is understood that the concepts taught therein can be applied to any type of SFET (both CFETs and SFETs having non-complementary transistors).

In aspects of the invention where the SFET is a CFET, the method includes forming vertically stacked n-type and p-type nanosheets, separated by a dielectric layer. Separate n-type and p-type S/D epitaxies are grown over exposed sidewalls of the nanosheets, and the S/D epitaxies are covered by a sacrificial material. This sacrificial material is not removed until after the replacement metal gate (RMG) process, ensuring contact protection against subsequent thermal processing. Once removed, the sacrificial material is replaced by separate n-type and p-type wrap-around contacts.

Turning now to a more detailed description of fabrication operations and resulting structures according to aspects of the invention, FIGS. 1-9 depict a semiconductor structure 100 after various fabrication operations in accordance with aspects of the invention. Although the cross-sectional diagrams depicted in FIGS. 1-9 are two-dimensional, it is understood that the diagrams depicted in FIGS. 1-9 represent three-dimensional structures. The top-down reference view 101 shown in FIG. 1 provides a reference point for the various cross-sectional views (X-view and Y-view) shown in FIGS. 1-9.

FIG. 1 depicts cross-sectional views of the semiconductor structure 100 taken along the lines X (across gate in fin region) and Y (across CFET stacks in source/drain region) of the reference view 101 after an initial set of fabrication operations have been applied as part of a method of fabricating a final semiconductor device according to one or more embodiments of the invention. In some embodiments of the invention, a CFET stack 102 is formed over a substrate 104.

The substrate 104 can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 104 can include a buried oxide layer 106 in a silicon-on-insulator (SOI) configuration. The buried oxide layer 106 can be made of any suitable dielectric material, such as, for example, a silicon oxide. In some embodiments of the invention, the buried oxide layer 106 is formed to a thickness of about 145 nm, although other thicknesses are within the contemplated scope of the invention.

In some embodiments of the invention, the CFET stack 102 can include one or more semiconductor layers 108 alternating with one or more sacrificial layers 110. In some embodiments of the invention, the semiconductor layers 108 and the sacrificial layers 110 are epitaxially grown layers. In some embodiments of the invention, a top portion of the CFET stack 102 is separated from a bottom portion of the CFET stack 102 by a sacrificial spacer layer 112. In some embodiments of the invention, the semiconductor layers 108 in the top portion of the CFET stack 102 define n-type channels in the final device, while the semiconductor layers 108 in the bottom portion of the CFET stack 102 define p-type channels in the final device (see, e.g., FIG. 10A). In some embodiments of the invention, the semiconductor layers 108 in the top portion of the CFET stack 102 define p-type channels in the final device, while the semiconductor layers 108 in the bottom portion of the CFET stack 102 define n-type channels in the final device.

For ease of discussion reference is made to operations performed on and to a CFET stack 102 having four nanosheets (e.g., the four semiconductor layers 108 shown in FIG. 1) alternating with four sacrificial layers 110, positioned such that the two top nanosheets are separated from the bottom two nanosheets by the sacrificial spacer layer 112. It is understood, however, that the CFET stack 102 can include any number of nanosheets alternating with a corresponding number of sacrificial layers. For example, the CFET stack 102 can include two nanosheets, five nanosheets, eight nanosheets, or any number of nanosheets, along with a corresponding number of sacrificial layers (i.e., as appropriate to form a nanosheet stack having a bottommost sacrificial layer under a bottommost nanosheet and a sacrificial layer between each pair of adjacent nanosheets). Moreover, while the CFET stack 102 is depicted as have a same number of channels (semiconductor layers 108) above and below the sacrificial spacer layer 112, this configuration is not required. In some embodiments of the invention, the n-type portion (in either an n-type top or n-type bottom configuration) has more or less channels (e.g., semiconductor layers 108) than the p-type portion.

The semiconductor layers 108 can be made of any suitable material such as, for example, monocrystalline silicon or silicon germanium. In some embodiments of the invention, the semiconductor layers 108 are silicon nanosheets. In some embodiments of the invention, the semiconductor layers 108 have a thickness of about 4 nm to about 10 nm, for example 6 nm, although other thicknesses are within the contemplated scope of the invention. In some embodiments of the invention, the substrate 104 and the semiconductor layers 108 can be made of a same semiconductor material. In other embodiments of the invention, the substrate 104 can be made of a first semiconductor material, and the semiconductor layers 108 can be made of a second semiconductor material.

The sacrificial layers 110 can be silicon or silicon germanium layers, depending on the material of the semiconductor layers 108 to meet etch selectivity requirements. For example, in embodiments where the semiconductor layers 108 are silicon nanosheets, the sacrificial layers 110 can be silicon germanium layers. In embodiments where the semiconductor layers 108 are silicon germanium nanosheets, the sacrificial layers 110 can be silicon germanium layers having a germanium concentration that is greater than the germanium concentration in the semiconductor layers 108. For example, if the semiconductor layers 108 are silicon germanium having a germanium concentration of 5 percent (sometimes referred to as SiGe5), the sacrificial layers 110 can be silicon germanium layers having a germanium concentration of about 25 (SiGe25), although other germanium concentrations are within the contemplated scope of the invention. In some embodiments of the invention, the sacrificial layers 110 have a thickness of about 12 nm to about 15 nm, for example 10 nm, although other thicknesses are within the contemplated scope of the invention.

The sacrificial spacer layer 112 can be made of silicon germanium layers having a germanium concentration selected to provide etch selectivity with respect to both the semiconductor layers 108 and the sacrificial layers 110. For example, in embodiments where the semiconductor layers 108 are SiGe10 nanosheets and the sacrificial layers 110 are SiGe30 layers, the sacrificial spacer layer 112 can be SiGe65, although other germanium concentrations are within the contemplated scope of the invention. As shown with respect to FIG. 2, the sacrificial spacer layer 112 is replaced by a dielectric spacer 202 that separates the n-type portion of the CFET stack 102 from the p-type portion. Consequently, the thickness of the sacrificial spacer layer 112 defines the final dielectric separation between the n-type and p-type portions of the CFET stack 102. In some embodiments of the invention, the sacrificial spacer layer 112 can have a thickness of about 5 nm to about 35 nm, for example 15 nm, although other thicknesses are within the contemplated scope of the invention.

As shown in FIG. 1, one or more sacrificial gates 114 (sometimes referred to as dummy gates) are formed over the CFET stacks 202. The portion of a nanosheet stack over which a gate is formed is referred to as a channel region. The sacrificial gates 114 can be made of any suitable material, such as, for example, a thin conformal SiO2 layer followed by amorphous silicon or polysilicon. Any known method for patterning a sacrificial gate can be used, such as, for example, a wet etch, a dry etch, or a combination of sequential wet and/or dry etches.

In some embodiments of the invention, a hard mask 116 is formed on the sacrificial gates 114. In some embodiments of the invention, the sacrificial gates 114 are formed by patterning the hard mask 116 and using a wet or dry etch process to selectively remove portions of the sacrificial gates 114 which are not covered by the pattered hard mask 116.

The hard mask 116 can be made of any suitable material, such as, for example, a silicon nitride. In some embodiments of the invention, a second hard mask (not depicted) is formed on the hard mask 116 to form a bilayer hard mask. In some embodiments, the second hard mask includes an oxide, such as, for example, silicon dioxide.

Figure 2:
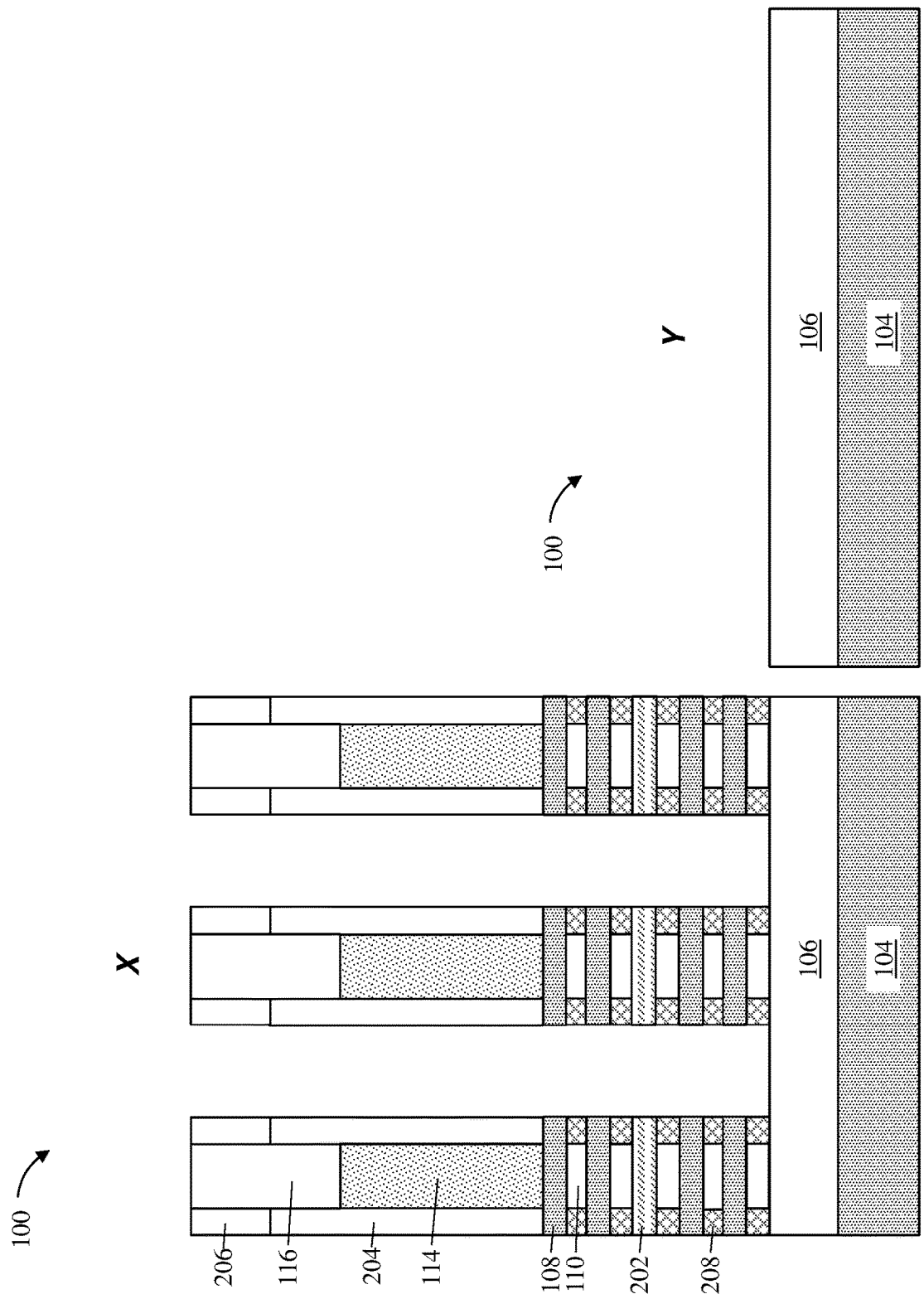
FIG. 2 depicts cross-sectional views of a semiconductor structure along the lines X and Y of the reference view after a processing operation according to one or more embodiments of the invention.

FIG. 2 depicts cross-sectional views of the semiconductor structure 100 taken along the lines X and Y of the reference view 101 after a processing operation according to one or more embodiments of the invention. In some embodiments of the invention, the sacrificial spacer layer 112 is replaced by the dielectric spacer 202. In some embodiments of the invention, the sacrificial spacer layer 112 is removed selective to the semiconductor layers 108 and the sacrificial layers 110, forming a cavity (not shown). The sacrificial spacer layer 112 can be removed selective to the semiconductor layers 108 and the sacrificial layers 110 using known processes, depending on the materials selected for a particular application. For example, SiGe65 can be removed selective to silicon and SiGe30 using a vapor phase HCl etch. In some embodiments of the invention, dielectric material is deposited into the cavity to form the dielectric spacer 202.

As shown in FIG. 2, in some embodiments of the invention, spacers 204 (also known as sidewall spacers or gate spacers) are formed on sidewalls of the sacrificial gates 114. In some embodiments of the invention, the spacers 204 are formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. For example, spacer material can be conformally deposited over the semiconductor structure 100 and selectively removed using a RIE to form the spacers 204.

In some embodiments of the invention, the dielectric spacer 202 is formed concurrently with the spacers 204 as the spacer material is deposited. In other words, the spacer material deposited onto sidewalls of the sacrificial gates 114 can also fill the cavity (not shown) that remains after removing the sacrificial spacer layer 112.

The spacers 204 can be made of any suitable material, such as, for example, a low-k dielectric, a nitride, silicon nitride, silicon oxide, SiON, SiC, SiOCN, or SiBCN. In some embodiments of the invention, the spacers 204 include silicon nitride. The spacers 204 can be formed to a thickness of about 5 to 40 nm, although other thicknesses are within the contemplated scope of the invention.

In some embodiments of the invention, the spacers 204 are recessed during a spacer pull-down that exposes sidewalls of the hard mask 116 (and possibly sidewalls of the sacrificial gates 114). In some embodiments of the invention, a spacer cap 206 is formed on the spacers 204 to recover the spacer thickness lost during the spacer pull-down. In other words, the spacer cap 206 can be formed such that the spacer pull-down does not overly recess the gate space (i.e., to prevent reducing a height of the sacrificial gates 114). The spacer cap 206 can be made of any suitable material, such as, for example, a low-k dielectric, a nitride, silicon nitride, silicon oxide, SiON, SiC, SiOCN, or SiBCN. In some embodiments of the invention, the spacer cap 206 includes SiO2. The spacer cap 206 can be formed to a thickness of about 5 to 40 nm, although other thicknesses are within the contemplated scope of the invention.

As further shown in FIG. 2, portions of the CFET stack 102 can be removed (sometimes referred to as a stack recess) to expose a surface of the buried oxide layer 106 (or the substrate 104 when the buried oxide layer 106 is not present). The CFET stack 102 can be patterned using, for example, a wet etch, a dry etch, or a combination of wet and/or dry etches. In some embodiments of the invention, the CFET stack 102 is patterned using a RIE. In some embodiments of the invention, the CFET stack 102 is patterned selective to the spacers 204 and/or the spacer cap 206. As discussed previously herein, this fin recess process can result in a partial loss of some of the spacers 204 thickness (a spacer pull-down) and the partial loss of gate space. If present, the spacer cap 206 can mitigate the spacer pull-down during the stack patterning process, preserving the gate space.

In some embodiments of the invention, the sacrificial layers 110 can be recessed and inner spacers 208 can be formed on the recessed sidewalls of the sacrificial layers 110. For example, sidewalls of the sacrificial layers 110 can be recessed to form cavities (not shown) in the CFET stack 102. In some embodiments of the invention, the inner spacers 208 are formed on recessed sidewalls of the sacrificial layers 110 by filling these cavities with dielectric material. In some embodiments of the invention, portions of the inner spacers 208 that extend beyond sidewalls of the nanosheet stack 206 are removed, using, for example, by an isotropic etching process. In this manner, sidewalls of the inner spacers 208 are coplanar to sidewalls of the semiconductor layers 108.

In some embodiments of the invention, the inner spacers 208 are formed using a CVD, PECVD, ALD, PVD, chemical solution deposition, or other like processes in combination with a wet or dry etch process. The inner spacers 208 can be made of any suitable material, such as, for example, a low-k dielectric, a nitride, silicon nitride, silicon dioxide, SiON, SiC, SiOCN, or SiBCN.

Figure 3:
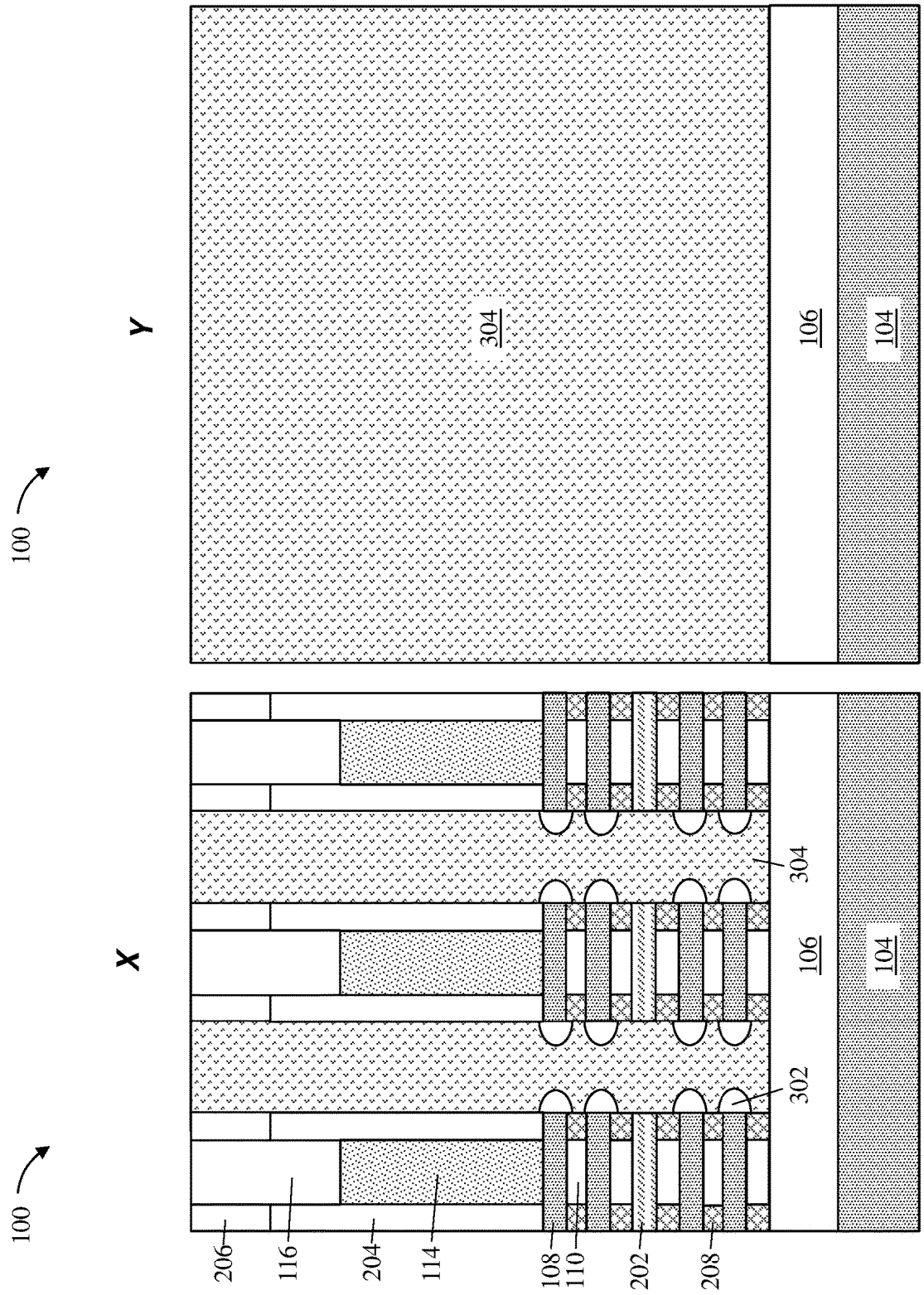
FIG. 3 depicts cross-sectional views of a semiconductor structure along the lines X and Y of the reference view after a processing operation according to one or more embodiments of the invention.

FIG. 3 depicts cross-sectional views of the semiconductor structure 100 taken along the lines X and Y of the reference view 101 after a processing operation according to one or more embodiments of the invention. In some embodiments of the invention, source and drain regions 302 are formed on exposed sidewalls of the semiconductor layers 108.

The source and drain regions 302 can be epitaxially grown using, for example, vapor-phase epitaxy (VPE), molecular beam epitaxy (MBE), liquid-phase epitaxy (LPE), or other suitable processes. The source and drain regions 302 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a Si layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, BF$_2$, or Al). In some embodiments of the invention, the source and drain regions 302 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$.

In some embodiments of the invention, the source and drain regions 302 are made of silicon or silicon germanium. In some embodiments of the invention, the source and drain regions 302 are made of silicon germanium doped with boron to a boron concentration of about 1 to about 15 percent, for example, 2 percent, although other boron concentrations are within the contemplated scope of the invention.

Figure 7:
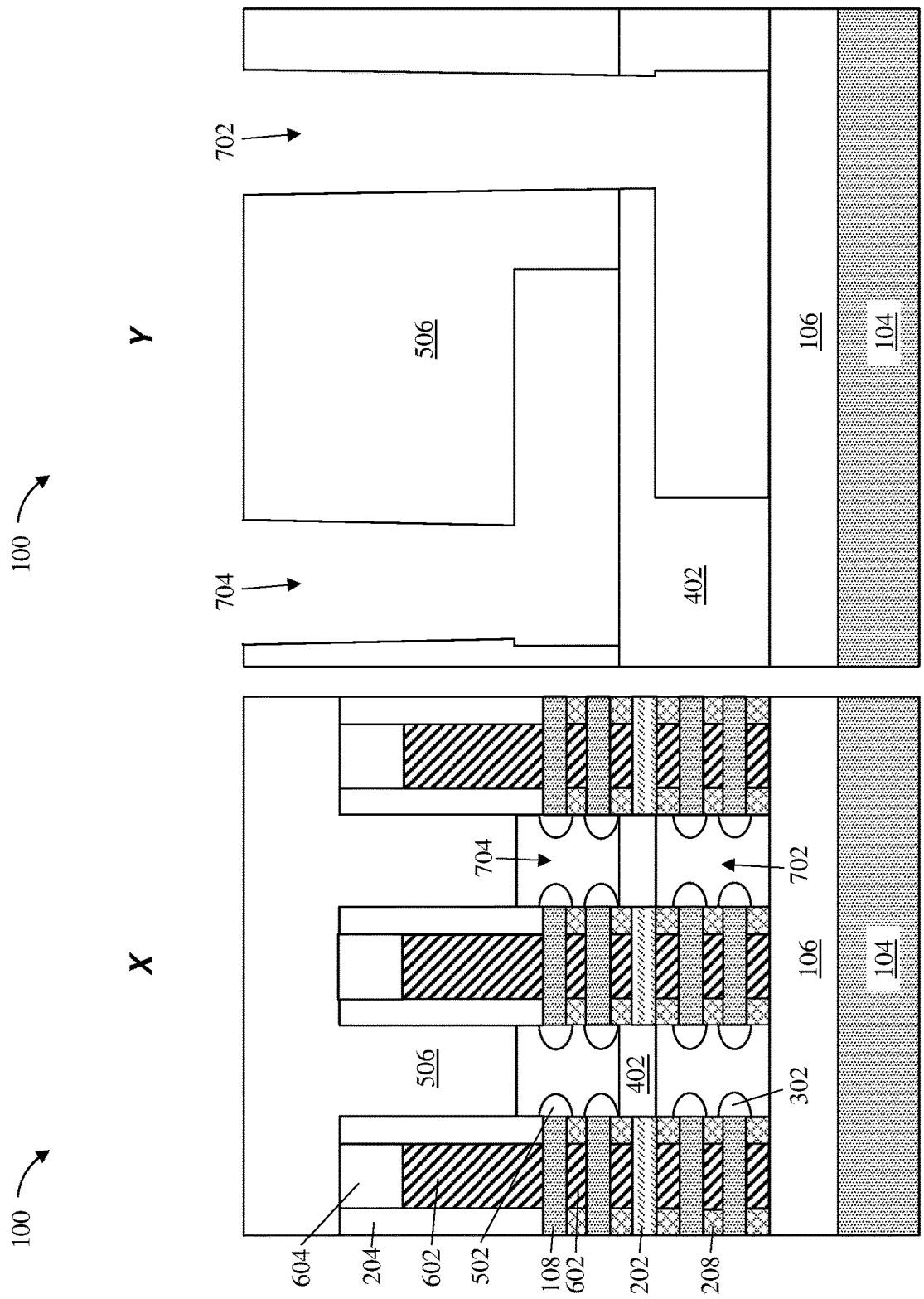
FIG. 7 depicts cross-sectional views of a semiconductor structure along the lines X and Y of the reference view after a processing operation according to one or more embodiments of the invention.

As shown in FIG. 3, a sacrificial layer 304 can be deposited or formed over the semiconductor structure 100. The sacrificial layer 304 can be made of any suitable material, such as, for example, oxides, a low-k dielectric, nitrides, silicon nitride, silicon oxide, SiON, SiC, SiOCN, and SiBCN. In some embodiments of the invention, the sacrificial layer 304 is made of titanium oxide (TiO$_x$) or aluminium oxide (AlOx). The material for the sacrificial layer 304 is selected to ensure etch selectivity during its subsequent removal (FIG. 7). In some embodiments of the invention, the sacrificial layer 304 can be planarized to a surface of the spacer cap 206, the hard mask 116, and/or the spacers 204, using, for example, chemical-mechanical planarization (CMP).

Figure 4:
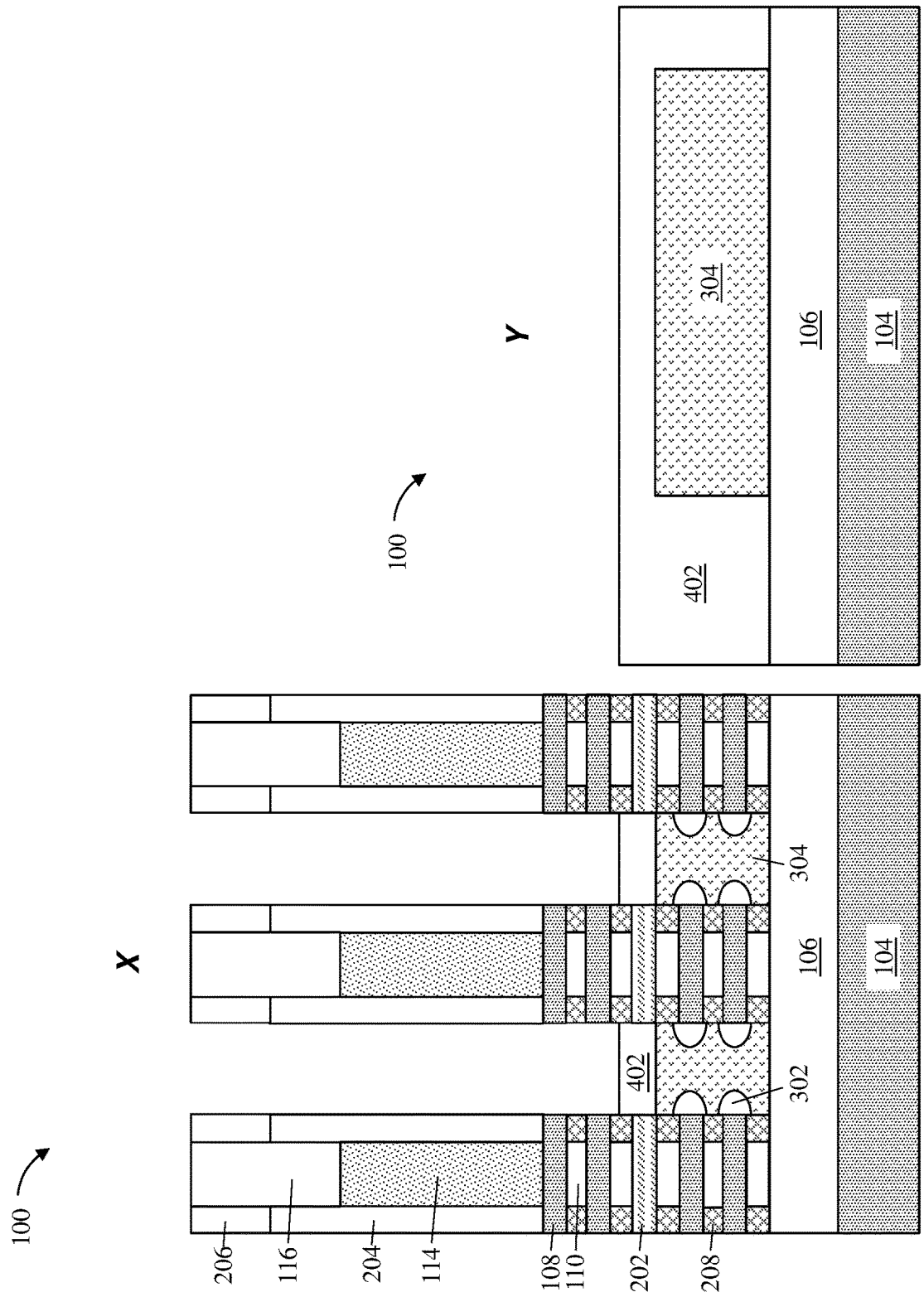
FIG. 4 depicts cross-sectional views of a semiconductor structure along the lines X and Y of the reference view after a processing operation according to one or more embodiments of the invention.

FIG. 4 depict cross-sectional views of the semiconductor structure 100 taken along the lines X and Y of the reference view 101 after a processing operation according to one or more embodiments of the invention. In some embodiments of the invention, the sacrificial layer 304 is recessed below a topmost surface of the dielectric spacer 202. Any known method for recessing a sacrificial material can be used, such as, for example, a wet etch, a dry etch, or a combination of sequential wet and/or dry etches. In some embodiments of the invention, the sacrificial layer 304 is recessed selective to the spacers 204 and the inner spacers 208.

In some embodiments of the invention, the exposed portions of the source and drain regions 302 are removed using for example, a wet etch, a dry etch, or a combination of sequential wet and/or dry etches. In some embodiments of the invention, the exposed portions of the source and drain regions 302 are removed during the same etching or patterning process used to recess the sacrificial layer 304.

In some embodiments of the invention, the sacrificial layer 304 is patterned to expose portions of the buried oxide layer 106 (or substrate 104, when the buried oxide layer 106 is not present). In some embodiments of the invention, an organic planarization layer (OPL, not depicted) is formed over the sacrificial layer 304. In some embodiments of the invention, a lithography process is used to define the region where portions of the sacrificial layer 304 will be removed. In some embodiments of the invention, the OPL layer is opened to expose a surface of the sacrificial layer 304, and the exposed portions of the sacrificial layer 304 are removed. In some embodiments of the invention, the exposed portions of the sacrificial layer 304 are removed using a wet etch, a dry etch, or a combination of sequential wet and/or dry etches. The OPL layer can be removed after patterning the sacrificial layer 304. In some embodiments of the invention, the OPL layer is removed using an OPL ash.

In some embodiments of the invention, an isolation dielectric 402 is formed over the sacrificial layer 304 and the buried oxide layer 106. The isolation dielectric 402 can be made of any suitable dielectric material, such as, for example, oxides, a low-k dielectric, nitrides, silicon nitride, silicon oxide, SiON, SiC, SiOCN, and SiBCN. In some embodiments of the invention, the isolation dielectric 402 is deposited between adjacent CFET stacks followed by recess etch to a height at or above the topmost surface of the dielectric spacer 202.

Figure 5:
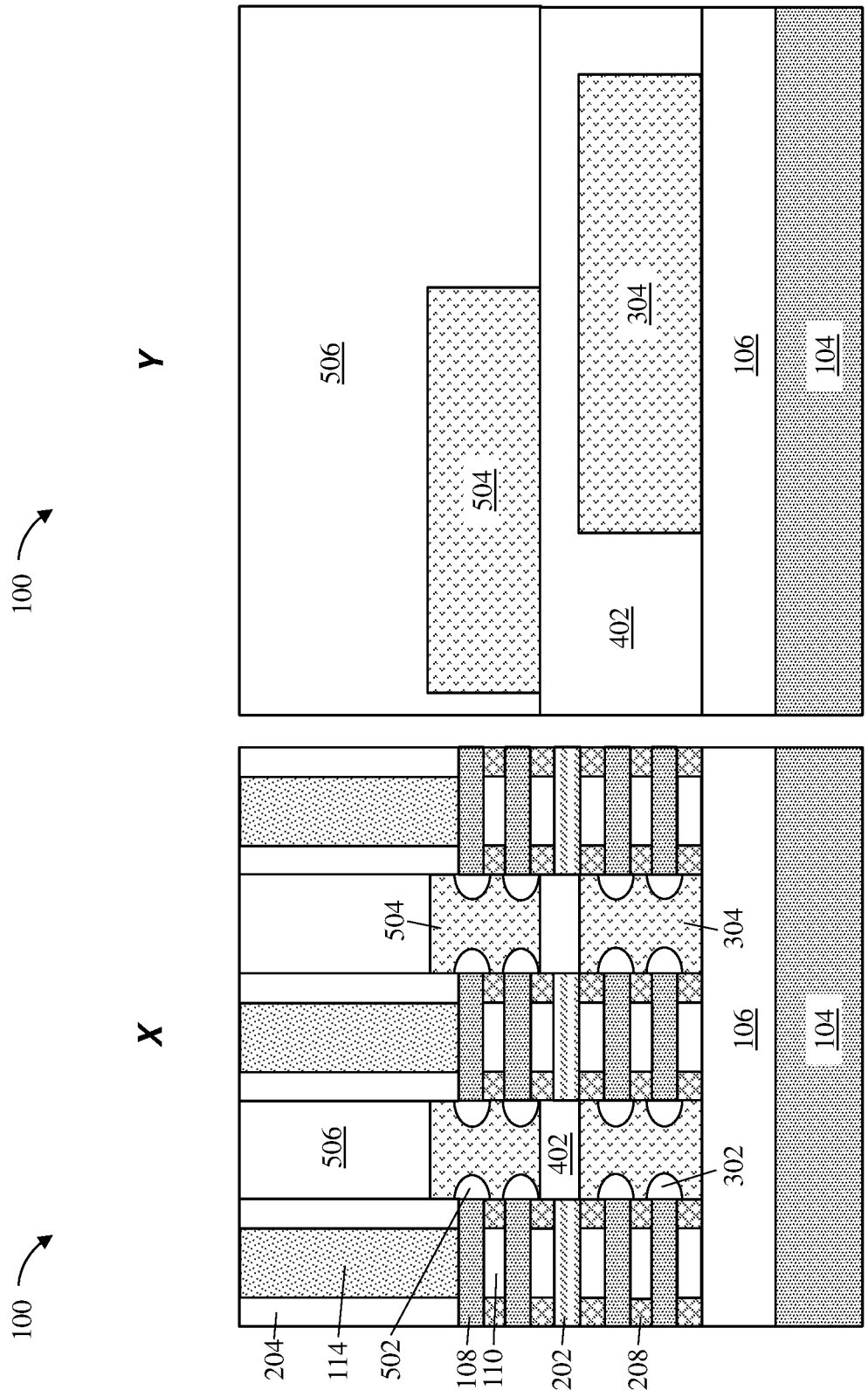
FIG. 5 depicts cross-sectional views of a semiconductor structure along the lines X and Y of the reference view after a processing operation according to one or more embodiments of the invention.

FIG. 5 depicts cross-sectional views of the semiconductor structure 100 taken along the lines X and Y of the reference view 101 after a processing operation according to one or more embodiments of the invention. In some embodiments of the invention, source and drain regions 502 are formed on exposed sidewalls of the semiconductor layers 108. The source and drain regions 502 can be formed in a similar manner as the source and drain regions 302 (FIG. 3), except that the source and drain regions 502 are only formed above the isolation dielectric 402.

In some embodiments of the invention, the source and drain regions 502 are doped by adding n-type dopants (e.g., P or As) or p-type dopants (e.g., Ga, B, BF$_2$, or Al). The dopant concentration in the doped regions can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$. In some embodiments of the invention, the source and drain regions 502 are doped with a dopant of opposite type from the dopant used to dope the source and drain regions 302. For example, the source and drain regions 502 can be doped using a p-type dopant and the source and drain regions 302 can be doped using an n-type dopant. Alternatively, the source and drain regions 502 can be doped using an n-type dopant and the source and drain regions 302 can be doped using a p-type dopant.

In some embodiments of the invention, the source and drain regions 502 are made of silicon or silicon germanium. In some embodiments of the invention, the source and drain regions 502 are made of silicon germanium doped with boron to a boron concentration of about 1 to about 15 percent, for example, 2 percent, although other boron concentrations are within the contemplated scope of the invention.

In some embodiments of the invention, a sacrificial layer 504 can be deposited or formed over the semiconductor structure 100. The sacrificial layer 504 can be formed, recessed, and patterned in a similar manner as the sacrificial layer 304 (as shown in FIG. 3). As shown in FIG. 5, in some embodiments of the invention, the sacrificial layer 504 is patterned to provide a horizontal offset with respect to the sacrificial layer 304. In this manner, the sacrificial layer 304 and the sacrificial layer 504 can be separately removed during the subsequent wrap-around contact module (as shown in FIG. 7).

The sacrificial layer 504 can be made of any suitable material, such as, for example, oxides, a low-k dielectric, nitrides, silicon nitride, silicon oxide, SiON, SiC, SiOCN, and SiBCN. In some embodiments of the invention, the sacrificial layer 504 is made of TiO$_x$ or AlOx. The material for the sacrificial layer 504 is selected to ensure etch selectivity during its subsequent removal (FIG. 7).

In some embodiments of the invention, an interlayer dielectric 506 can be formed over the semiconductor structure 100. The interlayer dielectric 506 can be made of any suitable dielectric material, such as, for example, porous silicates, carbon doped oxides, silicon dioxides, silicon nitrides, silicon oxynitrides, or other dielectric materials. Any known manner of forming the interlayer dielectric 506 can be utilized, such as, for example, CVD, PECVD, ALD, flowable CVD, spin-on dielectrics, or PVD. In some embodiments of the invention, the interlayer dielectric 506 and the isolation dielectric 402 are made of the same dielectric material, and together define a single continuous dielectric region. In some embodiments of the invention, the interlayer dielectric 506 and the isolation dielectric 402 are made of different dielectric materials.

In some embodiments of the invention, the semiconductor structure 100 is planarized to a surface of the sacrificial gates 114. The semiconductor structure 100 can be planarized using, for example, chemical-mechanical planarization (CMP). In some embodiments of the invention, the hard mask 116 and the spacer cap 206 can be removed during the planarization process.

Figure 6:
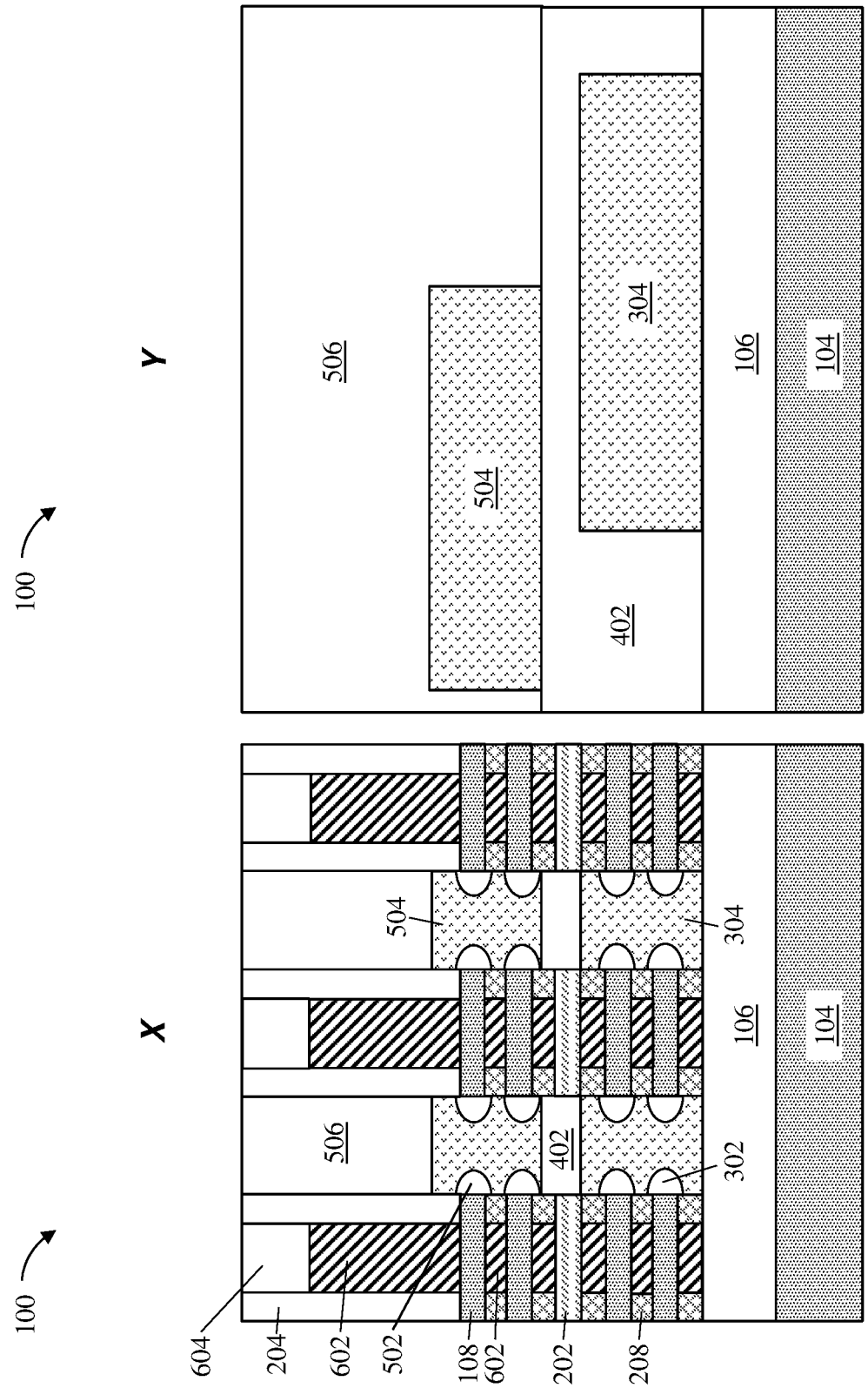
FIG. 6 depicts cross-sectional views of a semiconductor structure along the lines X and Y of the reference view after a processing operation according to one or more embodiments of the invention.

FIG. 6 depicts cross-sectional views of the semiconductor structure 100 taken along the lines X and Y of the reference view 101 after a processing operation according to one or more embodiments of the invention. As shown in FIG. 6, the sacrificial layers 110 and the sacrificial gates 114 can be removed and replaced with gates 602 (sometimes referred to as active or conductive gates).

The gates 602 can be high-k metal gates (HKMGs) formed over a channel region of the CFET stack 102 using, for example, known replacement metal gate (RMG) processes, or so-called gate-first processes. As used herein, the "channel region" refers to the portion of the semiconductor layers 108 over which the gates 602 are formed, and through which a current passes from source to drain in the final device (not shown). In some embodiments of the invention, the gates 602 are formed by removing the sacrificial gates 114, selectively removing the sacrificial layers 110 to release the nanosheet channels (semiconductor layers 108 in the channel region), and depositing the high-k/metal gate materials into the cavity left after removing the sacrificial gates 114 and the sacrificial layers 110.

In some embodiments of the invention, the gates 602 can include a gate dielectric(s) (not shown) and a work function metal stack (not shown). In some embodiments, the gates 602 include a main body formed from bulk conductive gate material(s).

In some embodiments of the invention, the gate dielectric is a high-k dielectric film formed on a surface (sidewall) of the semiconductor layers 108. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gates 602 include one or more work function layers (sometimes referred to as a work function metal stack) formed between the high-k dielectric film and a bulk gate material. In some embodiments of the invention, the gates 602 include one or more work function layers, but do not include a bulk gate material.

If present, the work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gates 602 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments, the gates 602 include a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

As further depicted in FIG. 6, gate hard masks 604 can be formed over the gates 602. The gate hard masks 604 can be made of any suitable material, such as, for example, silicon nitride. As the gate hard masks 604 are aligned to the gates 602 in the space between the spacers 204, the gate hard masks 604 can be thought of as self-aligned hard masks (sometimes referred to as SAC caps).

FIG. 7 depicts cross-sectional views of the semiconductor structure 100 taken along the lines X and Y of the reference view 101 after a processing operation according to one or more embodiments of the invention. In some embodiments of the invention, contact trenches are patterned using lithography followed by etching to expose the sacrificial materials 304 and 504, and then the sacrificial layer 304 and the sacrificial layer 504 are removed to define a first cavity 702 and a second cavity 704, respectively. Any known method for removing a sacrificial material can be used, such as, for example, a wet etch, a dry etch, or a combination of sequential wet and/or dry etches. In some embodiments of the invention, the sacrificial layer 304 and the sacrificial layer 504 are removed selective to the spacers 204, the inner spacers 208, the source and drain regions 302, and the source and drain regions 502. As shown in FIG. 7, in some embodiments of the invention, additional dielectric material is formed or deposited over the semiconductor structure 100 to raise the height of the interlayer dielectric 506 prior to removing the sacrificial layer 304 and the sacrificial layer 504.

As further shown in FIG. 7, the first cavity 702 and the second cavity 704 can be patterned such that the cavities 702 and 704 are horizontally offset. In other words, the first cavity 702 can be formed from a first end of the gates 602 and the second cavity 704 can be formed from a second, opposite end of the gates 602. In some embodiments of the invention, the first cavity 702 and the second cavity 704 have different depths. In some embodiments of the invention, the first cavity 702 extends to the source and drain regions 302 below the topmost surface of the isolation dielectric 402 and the second cavity 704 extends to the source and drain regions 502 and is positioned on the topmost surface of the isolation dielectric 402.

Figure 8:
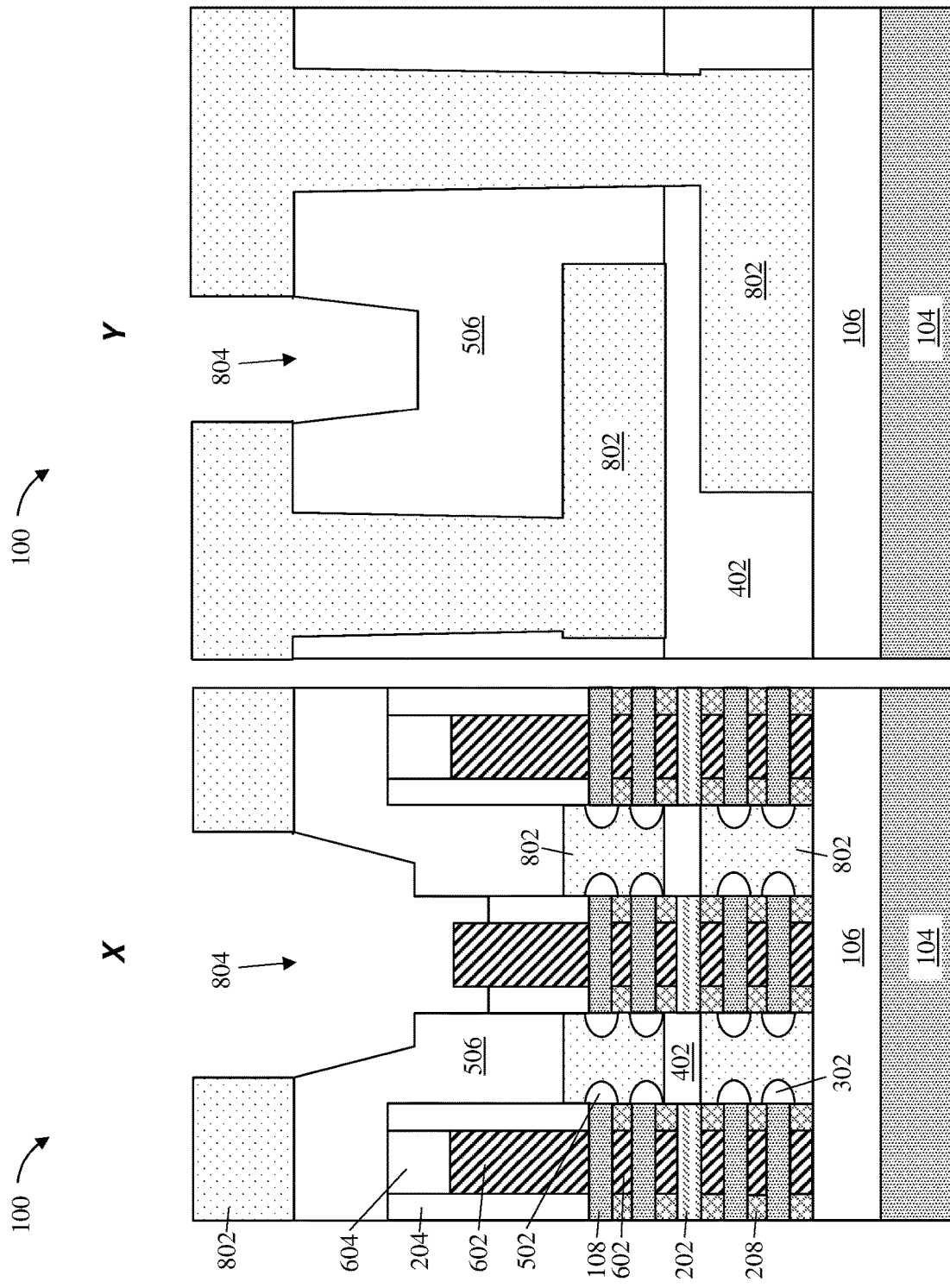
FIG. 8 depicts cross-sectional views of a semiconductor structure along the lines X and Y of the reference view after a processing operation according to one or more embodiments of the invention.

FIG. 8 depicts cross-sectional views of the semiconductor structure 100 taken along the lines X and Y of the reference view 101 after a processing operation according to one or more embodiments of the invention. In some embodiments of the invention, a patterning material 802, such as OPL is formed on the interlayer dielectric 506 and in the first cavity 702 and the second cavity 704.

In some embodiments of the invention, a gate contact trench 804 is formed by patterning the patterning material 802 and using a wet or dry etch process to selectively remove the gate hard masks 604 which are not covered by patterning material 802. As shown in FIG. 8, in some embodiments of the invention, the spacers 204 that are not covered by the patterning material 802 are recessed below a topmost surface of the gates 602.

Figure 9:
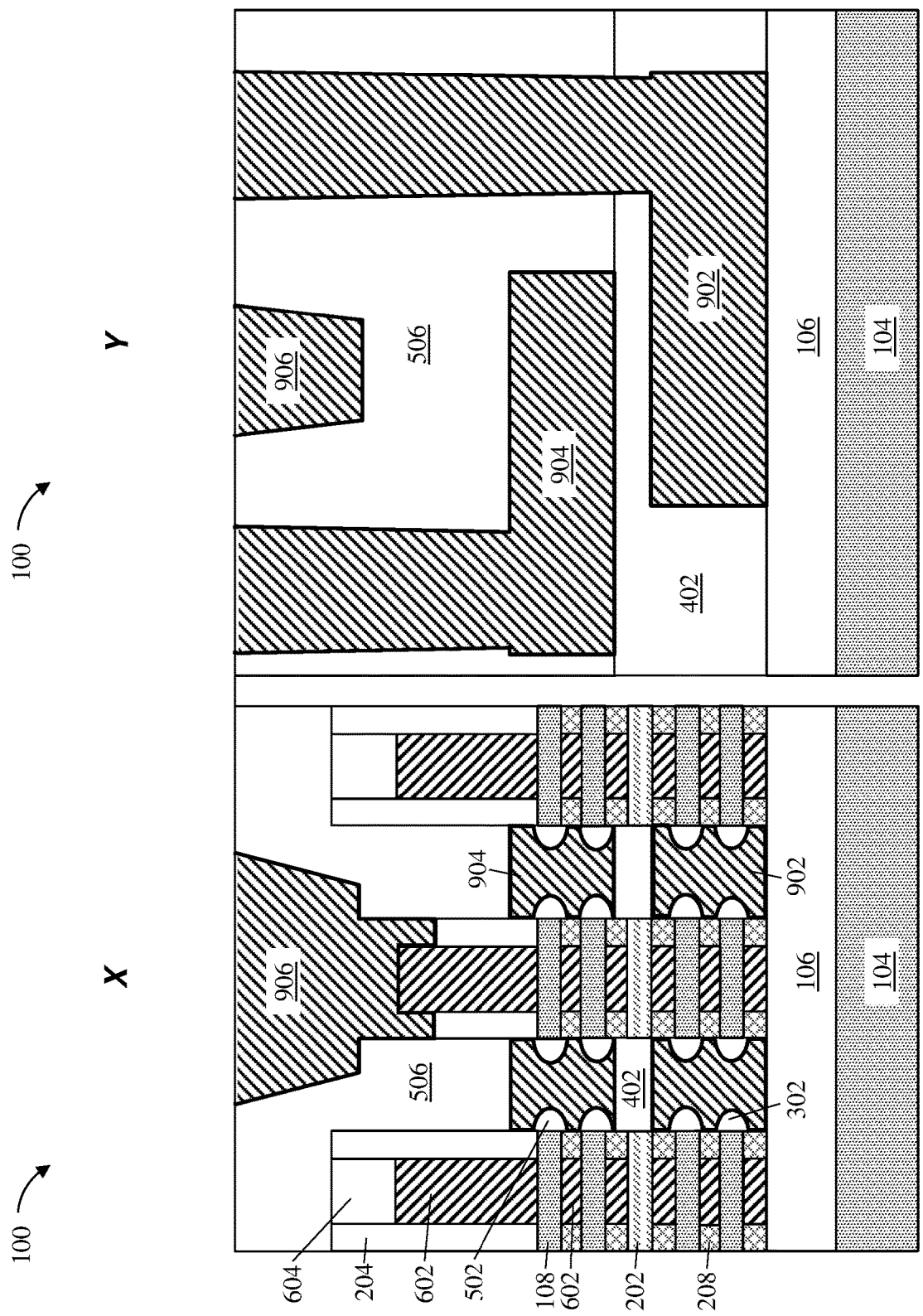
FIG. 9 depicts cross-sectional views of a semiconductor structure along the lines X and Y of the reference view after a processing operation according to one or more embodiments of the invention.

FIG. 9 depicts cross-sectional views of the semiconductor structure 100 taken along the lines X and Y of the reference view 101 after a processing operation according to one or more embodiments of the invention. In some embodiments of the invention, the patterning material 802 is removed and the first cavity 702, the second cavity 704, and the gate contact trench 804 are filled with conductive material (e.g., a conformal metal liner (not shown), such as NiPt, Ni, Ti is initially deposited and forms a silicide with the source and drain regions 302 and 502 followed by bulk metals such as Co, W or Ru) to form a first wrap-around contact 902, a second wrap-around contact 904, and a gate contact 906, respectively. In some embodiments of the invention, the contact material overfills the first cavity 702, the second cavity 704, and the gate contact trench 804, forming overburdens that can be removed using, for example CMP.

As further shown in FIG. 9, the first wrap-around contact 902 extends to the source and drain regions 302 below the topmost surface of the isolation dielectric 402 and the second wrap-around contact 904 extends to the source and drain regions 502 and is positioned on the topmost surface of the isolation dielectric 402. In other words, the first wrap-around contact 902 serves as a source/drain contact for the portion of the CFET stack 102 below the isolation dielectric 402 and the second wrap-around contact 904 serves as a source/drain contact for the portion of the CFET stack 102 above the isolation dielectric 402.

Figure 10:
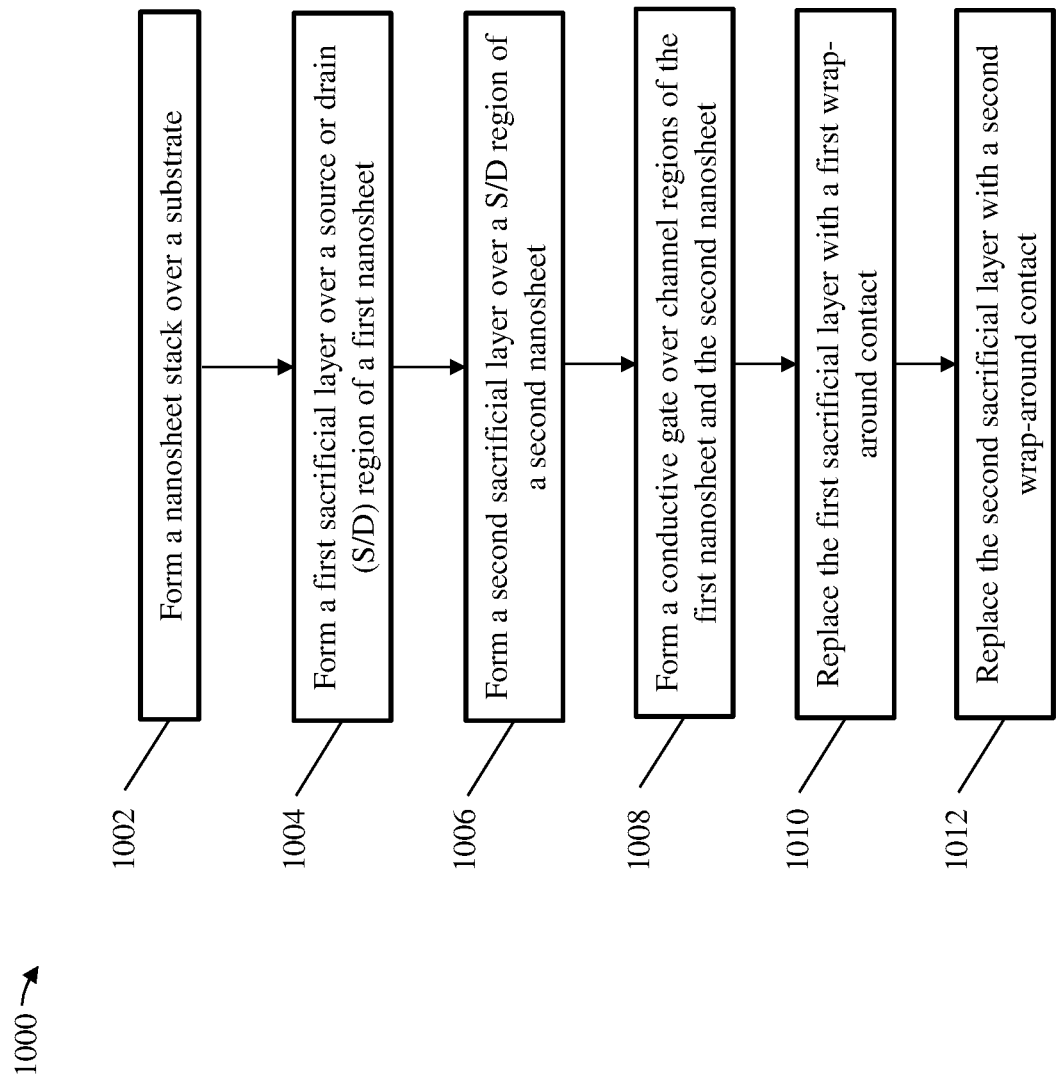
FIG. 10 depicts a flow diagram illustrating a method according to one or more embodiments of the invention.

FIG. 10 depicts a flow diagram 1000 illustrating a method for forming a semiconductor device according to one or more embodiments of the invention. As shown at block 1002, a nanosheet stack is formed over a substrate. In some embodiments of the invention, the nanosheet stack includes a first nanosheet and a second nanosheet separated by a dielectric spacer. In some embodiments of the invention, the nanosheet stack is a complementary stack (i.e., the first nanosheet and the second nanosheet are complementary). For example, the first nanosheet can be an n-type nanosheet and the second nanosheet can be a p-type nanosheet.

In some embodiments of the invention, forming the nanosheet stack includes forming a first nanosheet stack over the substrate. The first nanosheet stack can include the first nanosheet and a first sacrificial layer. In some embodiments of the invention, a sacrificial spacer layer is formed on the first nanosheet stack. In some embodiments of the invention, a second nanosheet stack is formed on the sacrificial spacer layer. The second nanosheet stack can include the second nanosheet and a second sacrificial layer. In some embodiments of the invention, the sacrificial spacer layer is removed selective to the first sacrificial layer and the second sacrificial layer to define a cavity between the first nanosheet stack and the second nanosheet stack. In some embodiments of the invention, the cavity is filled with dielectric material.

At block 1004, a first sacrificial layer is formed over a S/D region of the first nanosheet. In some embodiments of the invention, the S/D region of the first nanosheet is formed on an exposed sidewall of the first nanosheet. In some embodiments of the invention, the first S/D region is confined to (or selectively grown from) the sidewall of the nanosheet such that the first S/D region does not merge with another S/D region in the first nanosheet stack (as shown in FIG. 3). In some embodiments of the invention, the first S/D region can be epitaxially grown to just cover the first nanosheet sidewalls, while remaining small enough that the epitaxy does not merge with other S/D epitaxies similarly formed on other nanosheets of the first nanosheet stack.

At block 1006, a second sacrificial layer is formed over a S/D region of the second nanosheet. In some embodiments of the invention, the S/D region of the second nanosheet is formed on an exposed sidewall of the second nanosheet. In some embodiments of the invention, the second S/D region is confined to (or selectively grown from) the sidewall of the nanosheet such that the second S/D region does not merge with another S/D region in the second nanosheet stack (as shown in FIG. 5). In some embodiments of the invention, the second S/D region can be epitaxially grown to just cover the second nanosheet sidewalls, while remaining small enough that the epitaxy does not merge with other S/D epitaxies similarly formed on other nanosheets of the second nanosheet stack. In some embodiments of the invention, the S/D region of the first nanosheet includes a p-type epitaxy and the S/D region of the second nanosheet includes an n-type epitaxy.

At block 1008, a conductive gate is formed over channel regions of the first nanosheet and the second nanosheet. In some embodiments of the invention, the conductive gate is a HKMG formed in an RMG process. In some embodiments of the invention, the first sacrificial layer and the second sacrificial layer are removed after the RMG process.

At 1010, the first sacrificial layer is replaced with a first wrap-around contact. At 1012 the second sacrificial layer is replaced with a second wrap-around contact. In some embodiments of the invention, removing the first sacrificial layer includes forming a first trench that exposes a surface of the first sacrificial layer. In some embodiments of the invention, removing the second sacrificial layer includes forming a second trench that exposes a surface of the second sacrificial layer. In some embodiments of the invention, the first trench and the second trench are horizontally offset with respect to each other.

The method can further include patterning the first sacrificial layer and the second sacrificial layer to provide a horizontal offset between the first sacrificial layer and the second sacrificial layer.

Figure 11:
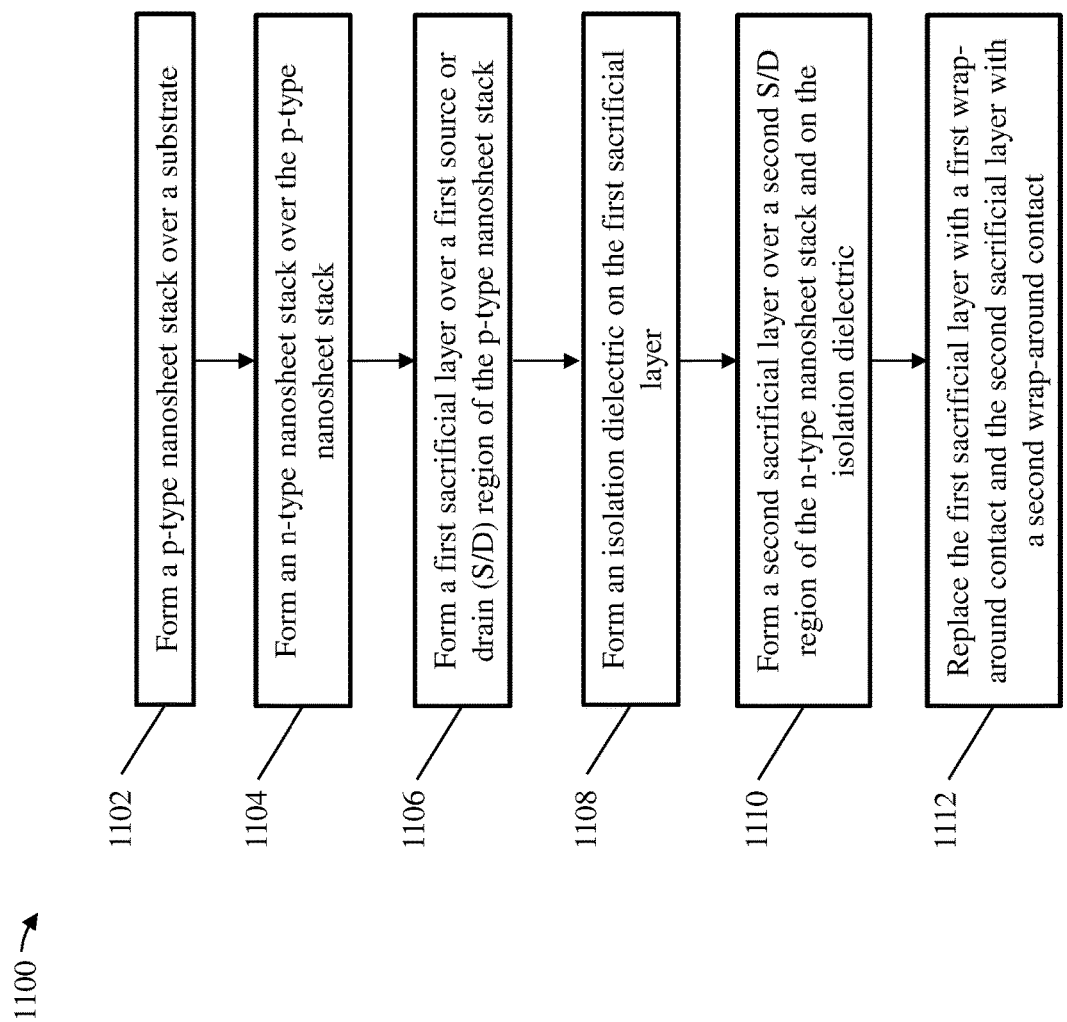
FIG. 11 depicts a flow diagram illustrating a method according to one or more embodiments of the invention.

FIG. 11 depicts a flow diagram 1100 illustrating a method for forming a semiconductor device according to one or more embodiments of the invention. As shown at block 1102, a p-type nanosheet stack is formed over a substrate. The p-type nanosheet stack can include a first nanosheet and a second nanosheet. At block 1104, an n-type nanosheet stack is formed over the p-type nanosheet stack. The n-type nanosheet stack can include a third nanosheet and a fourth nanosheet. In some embodiments of the invention, a dielectric spacer is formed between the p-type nanosheet stack and the n-type nanosheet stack.

At block 1106, a first sacrificial layer is formed over a first S/D region of the p-type nanosheet stack. At block 1108, an isolation dielectric is formed on the first sacrificial layer. At block 1110, a second sacrificial layer is formed over a second S/D region of the n-type nanosheet stack and on the isolation dielectric. In some embodiments of the invention, the S/D region of the first nanosheet is formed on an exposed sidewall of the first nanosheet and the S/D region of the second nanosheet is formed on an exposed sidewall of the second nanosheet. In some embodiments of the invention, the first sacrificial layer and the second sacrificial layer are patterned to provide a horizontal offset between the first sacrificial layer and the second sacrificial layer. In some embodiments of the invention, removing the first sacrificial layer includes forming a first trench that exposes a surface of the first sacrificial layer and removing the second sacrificial layer includes forming a second trench that exposes a surface of the second sacrificial layer.

At block 1112, the first sacrificial layer is replaced with a first wrap-around contact and the second sacrificial layer is replaced with a second wrap-around contact. In some embodiments of the invention, the first wrap-around contact includes a first contact liner and the second wrap-around contact includes a second contact liner.

In some embodiments of the invention, a conductive gate is formed over a channel region of the p-type and n-type nanosheet stacks using an RMG process. In some embodiments of the invention, the first sacrificial layer and the second sacrificial layer are removed after the RMG process.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a nanosheet stack over a substrate, the nanosheet stack comprising a top portion and a bottom portion separated by a dielectric spacer;
   a plurality of vertically stacked first source or drain (S/D) regions, each of the first S/D regions on a sidewall of a different nanosheet in the bottom portion of the nanosheet stack, each of the first S/D regions confined to the respective sidewall of one nanosheet such that none of the plurality of first S/D regions merge and each sidewall of the different nanosheets in the bottom portion is covered by a separate first S/D region;

a plurality of vertically stacked second S/D regions, each of the second S/D regions on a sidewall of a different nanosheet in the top portion of the nanosheet stack, each of the second S/D regions confined to the respective sidewall of one nanosheet such that none of the plurality of second S/D regions merge and each sidewall of the different nanosheets in the top portion is covered by a separate second S/D region;

a first wrap-around contact formed over the first plurality of S/D regions; and a second wrap-around contact formed over the second plurality of S/D regions.

2. The semiconductor device of claim 1, wherein the top portion is an n-type portion and the bottom portion is a p-type portion.

3. The semiconductor device of claim 1, wherein the top portion is a p-type portion and the bottom portion is an n-type portion.

4. The semiconductor device of claim 1, wherein the first wrap-around contact is horizontally offset from the second wrap-around contact.

5. A semiconductor device comprising:

a first nanosheet stack over a substrate, the first nanosheet stack comprising a first nanosheet;

a second nanosheet stack over the first nanosheet stack, the second nanosheet stack comprising a second nanosheet;

first source and drain regions on sidewalls of the first nanosheet, the first source and drain regions comprising a first dopant, the first source and drain regions confined to the respective sidewalls of the first nanosheet such that the first source and drain regions do not merge with other source and drain regions on respective other nanosheets in the first nanosheet stack;

second source and drain regions on sidewalls of the second nanosheet, the second source and drain regions comprising a second dopant having an opposite doping type from the first dopant, the second source and drain regions confined to the respective sidewalls of the second nanosheet such that the second source and drain regions do not merge with other source and drain regions on respective other nanosheets in the second nanosheet stack;

an isolation dielectric between the first source and drain regions and the second source and drain regions;

a first wrap-around contact formed over the first source and drain regions, the first wrap-around contact in direct contact with a bottommost surface of the isolation dielectric; and a second wrap-around contact formed over the second source and drain regions, the second wrap-around contact in direct contact with a topmost surface of the isolation dielectric.

6. The semiconductor device of claim 5, wherein the first dopant comprises an n-type dopant and the second dopant comprises a p-type dopant.

7. The semiconductor device of claim 5, wherein the second dopant comprises an n-type dopant and the first dopant comprises a p-type dopant.

8. The semiconductor device of claim 5 further comprising a dielectric spacer between the first nanosheet stack and the second nanosheet stack.

* * * * *